(12) United States Patent
Horng et al.

(10) Patent No.: US 7,449,345 B2
(45) Date of Patent: Nov. 11, 2008

(54) CAPPING STRUCTURE FOR ENHANCING DR/R OF THE MTJ DEVICE

(75) Inventors: Cheng T. Horng, San Jose, CA (US); Ru-Ying Tong, San Jose, CA (US); Liubo Hong, San Jose, CA (US); Min Li, Dublin, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 197 days.

(21) Appl. No.: 10/868,715

(22) Filed: Jun. 15, 2004

(65) Prior Publication Data

US 2005/0276099 A1 Dec. 15, 2005

(51) Int. Cl.
*G11B 5/72* (2006.01)
*H01L 41/06* (2006.01)

(52) U.S. Cl. .............. 438/3; 427/132; 257/421; 257/E43.005; 257/E43.006

(58) Field of Classification Search ............ 438/3; 257/421–428, E43.001–E43.007; 427/127–132; 428/800–848.9
See application file for complete search history.

(56) References Cited

U.S. PATENT DOCUMENTS

| | | | | |
|---|---|---|---|---|
| 6,127,045 A * | 10/2000 | Gill | ............... | 428/611 |
| 6,153,319 A * | 11/2000 | Hasegawa | ............... | 428/811.2 |
| 6,266,218 B1 | 7/2001 | Carey et al. | ............... | 360/324.12 |
| 6,301,089 B1 * | 10/2001 | Saito et al. | ............... | 360/324.12 |
| 6,338,899 B1 * | 1/2002 | Fukuzawa et al. | ...... | 360/324.12 |
| 6,600,638 B2 | 7/2003 | Gill | ............... | 360/324.11 |
| 6,624,987 B1 | 9/2003 | Hayashi et al. | ......... | 360/324.2 |
| 6,639,291 B1 | 10/2003 | Sin et al. | | |
| 6,657,825 B2 | 12/2003 | Ho et al. | ............... | 360/321 |
| 6,674,617 B2 | 1/2004 | Gill | ............... | 360/324.12 |
| 6,700,759 B1 * | 3/2004 | Knapp et al. | ............ | 360/324.2 |
| 6,703,654 B1 | 3/2004 | Horng et al. | ............... | 257/295 |
| 6,992,910 B1 * | 1/2006 | Ju et al. | ............... | 365/130 |

(Continued)

OTHER PUBLICATIONS

Co-pending U.S. Appl. No. 10/844,171, filed May 12, 2004, assigned to the same assignee.

(Continued)

*Primary Examiner*—Douglas M. Menz
*Assistant Examiner*—Matthew W Such
(74) *Attorney, Agent, or Firm*—Saile Ackerman LLC; Stephen B. Ackerman (57) ABSTRACT

An MTJ in an MRAM array or in a TMR read head is comprised of a capping layer with a lower inter-diffusion barrier layer, an intermediate oxygen gettering layer, and an upper metal layer that contacts a top conductor. The composite capping layer is especially useful with a moderate spin polarization free layer such as a NiFe layer with a Fe content of about 17.5 to 20 atomic %. The capping layer preferably has a Ru/Ta/Ru configuration in which the lower Ru layer is about 10 to 30 Angstroms thick and the Ta layer is about 30 Angstroms thick. As a result, a high dR/R of about 40% is achieved with low magnetostriction less than about 1.0 E−6 in an MTJ in an MRAM array. Best results are obtained with an AlOx tunnel barrier layer formed by an in-situ ROX process on an 8 to 10 Angstrom thick Al layer.

15 Claims, 3 Drawing Sheets

U.S. PATENT DOCUMENTS

| | | | |
|---|---|---|---|
| 7,001,680 B2* | 2/2006 | Gill | 428/811.1 |
| 7,053,429 B2* | 5/2006 | Katti | 257/295 |
| 2001/0024346 A1* | 9/2001 | Terunuma et al. | 360/324.1 |
| 2002/0054462 A1* | 5/2002 | Sun et al. | 360/324.2 |
| 2002/0058158 A1 | 5/2002 | Odagawa et al. | |
| 2003/0030944 A1* | 2/2003 | Lin et al. | 360/324.1 |
| 2003/0053268 A1* | 3/2003 | Lin et al. | 360/324.1 |
| 2003/0053270 A1* | 3/2003 | Gill | 360/324.11 |
| 2003/0152810 A1* | 8/2003 | Kawai et al. | 428/695 |
| 2003/0185046 A1* | 10/2003 | Nishiyama et al. | 365/158 |
| 2004/0101978 A1* | 5/2004 | Linn et al. | 438/3 |
| 2004/0146686 A1* | 7/2004 | Kim et al. | 428/65.5 |
| 2004/0150922 A1* | 8/2004 | Kagami et al. | 360/324.2 |
| 2004/0188733 A1* | 9/2004 | Asao et al. | 257/295 |
| 2005/0014295 A1* | 1/2005 | Sharma | 438/3 |
| 2005/0024790 A1* | 2/2005 | Pinarbasi | 360/324.2 |
| 2005/0040447 A1* | 2/2005 | Fukuzumi | 257/295 |
| 2005/0048775 A1* | 3/2005 | Donohue | 438/685 |

OTHER PUBLICATIONS

Co-pending U.S. Appl. No. 10/849,310, filed May 19, 2004, assigned to the same assignee.

"Exchange-biased magnetic tunnel junctions and application to non-volatile magnetic random access memory (invited)," by S.S. Parkin et al., Jrnl. of Applied Physics, vol. 85, No. 8, Apr. 15, 1999, pp. 5828-5833.

"Progress and Outlook for MRAM Technology", by S.Tehrani et al, IEEE Trans. on Magnetics, vol. 35, No. 5, Sep. 1999, pp. 2814-2819.

"A 0.18um 4Mb Toggling MRAM," by M. Durlam et al., IEEE 2003, 0-7803-7873—Mar. 2003.

"Fabrication of high-magnetoresistance tunnel junctions using $Co_{75}Fe_{25}$ ferromagnetic electrodes," by Xiu-Feng Han et al., Applied Physics Letters, vol. 77, No. 2, Jul. 10, 2000, pp. 283-285.

"High-Performance MRAM Technology with an Improved Magnetic Tunnel Junction Material," by M. Motoyoshi et al., 2002 Symp. On VLSI Tech. Digest of Tech. Papers, pp. 212-213.

"Oxygen as a surfactant in the growth of giant magneto-resistance spin valves," by W. F. Egelhoff, Jr., Jrnl. of Applied Physics, vol. 82, No. 12, Dec. 15, 1997, pp. 6142-6151.

\* cited by examiner

FIG. 7

CAPPING STRUCTURE FOR ENHANCING DR/R OF THE MTJ DEVICE

RELATED PATENT APPLICATIONS

This application is related to the following: Ser. No. 10/844,171, filing date May 12, 2004; and Ser. No. 10/849,310, filing date May 19, 2004; all assigned to a common assignee.

FIELD OF THE INVENTION

The invention relates to a high performance Magnetic Tunneling Junction (MTJ) element and a method for making the same, and more particularly, to a capping layer that increases the magnetoresistive (MR) ratio while minimizing magnetostriction.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. An MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations.

Figure 1:
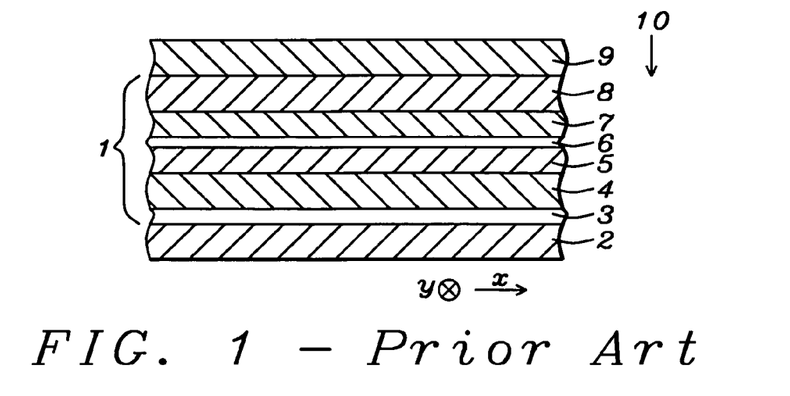
FIG. 1 is a cross-sectional view showing a conventional MTJ element which is formed between a bottom electrode and a top electrode in an MRAM structure.

In FIG. 1, an MTJ element 1 is shown that is based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode 2 such as a first conductive line and a top electrode 9 which is a second conductive line. The bottom electrode 2 typically has a seed layer/conductive layer/capping layer configuration such as Ta/Cu/Ta or NiCr/Ru/Ta. The bottom layer 3 in the MTJ element 1 is generally comprised of one or more seed layers that may be NiCr or Ta/NiCr, for example, which promote a smooth and dense crystal growth in overlying MTJ layers. Next, an antiferromagnetic (AFM) pinning layer 4 is formed such as PtMn or IrMn. There is a ferromagnetic "pinned" layer 5 on the AFM layer 4 that may be a composite of multiple layers including CoFe layers. The thin tunnel barrier layer 6 above the pinned layer 5 is generally comprised of a dielectric material such as AlOx that is formed by first depositing an Al layer and then performing an in-situ oxidation. A ferromagnetic "free" layer 7 which may be another composite layer that includes one or both of CoFe and NiFe is formed on the tunnel barrier layer 6. At the top of the MTJ stack is a capping layer 8. This MTJ stack has a so-called bottom spin valve configuration. Alternatively, an MTJ stack may have a top spin valve configuration in which a free layer is formed on a seed layer followed by sequentially forming a tunnel barrier layer, a pinned layer, AFM layer, and a capping layer.

The pinned layer 5 has a magnetic moment that is fixed in the y direction by exchange coupling with the adjacent AFM layer 4 that is also magnetized in the y direction. The free layer 7 has a magnetic moment that is either parallel or anti-parallel to the magnetic moment in the pinned layer. The tunnel barrier layer 6 is so thin that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current 10 is passed from the top electrode 9 to the bottom electrode 3 in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

A high performance MTJ element is characterized by a high magnetoresistive (MR) ratio which is dR/R where R is the minimum resistance of the MTJ element and dR is the change in resistance observed by changing the magnetic state of the free layer. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance x area (RA) value and a high breakdown voltage (Vb), it is necessary to have a uniform tunnel barrier layer which is free of pinholes that is promoted by a smooth and densely packed growth in the AFM and pinned layers. Although a high RA value of about 10000 ohm-$\mu m^2$ is acceptable for a large area (A), RA should be relatively small (<1000 ohm-$\mu m^2$) for smaller areas. Otherwise, R would be too high to match the resistivity of the transistor which is connected to the MTJ.

Desirable properties for the free layer include low magnetostriction and low coercivity (magnetic softness). A trend in the industry is to employ high spin polarization materials such as CoFe in which the atomic % of Fe is >20%, or NiFe in which the atomic % of Fe is >50%, or $[(CoFe)_{0.8}B_{0.2}]$ with $\geq 25$ atomic % Fe in the CoFe composition in order to produce a higher MR ratio. Higher spin polarization in a ferromagnetic layer is normally associated with a high saturation magnetization (Ms). In the high Ms free layers, the magnetostriction ($\lambda_S$) is typically too high to be suitable for MRAM applications. Therefore, an improved MTJ element in an MRAM array is needed which has a high MR ratio of over 30% and a low $\lambda_S$ value less than about 1×10E−06.

Figure 2:
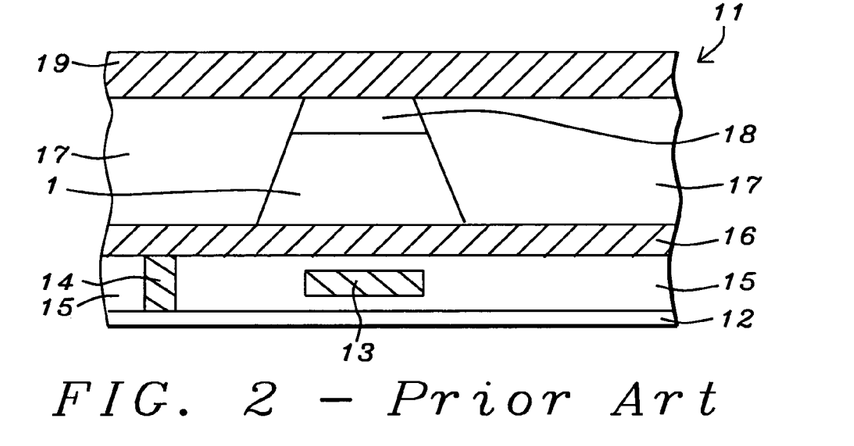
FIG. 2 is a cross-sectional view of an MRAM structure in which an MTJ is formed between a bottom conductor electrode and an overlying bit line while a word line is located in an insulation layer below the bottom conductor.

Referring to FIG. 2, the MTJ 1 element is shown disposed on a bottom conductor 16 in an MRAM cell 11 that has a top conductor 19. The substrate 12 is comprised of a transistor (not shown) that is typically connected to the bottom conductor by a stud 14. A word line 13 is formed below the MTJ element 1 and within a first insulation layer 15 that is usually a composite layer consisting of a stack of two or more dielectric layers on the substrate which are not shown in order to simplify the drawing. The MTJ element 1 contacts the top conductor 19 (bit line) through a capping layer 18 and is formed in a second insulation layer 17 that is disposed on the bottom conductor 16. From a top-down perspective (not shown), a plurality of MTJ elements is formed in an array between multiple rows of bottom conductors and multiple columns of top conductors.

Figure 3:
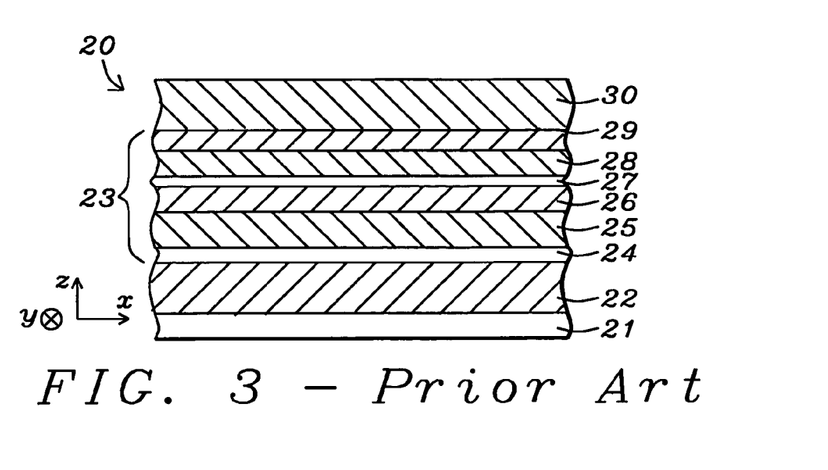
FIG. 3 is a cross-sectional view of a conventional MTJ element formed between bottom and top shields and which serves as a sensor in a TMR read head

In addition to MRAM applications, an MTJ element with a thinner tunnel barrier layer to give a very low RA (<5 ohms-$\mu m^2$) may be employed as a magnetoresistive (MR) sensor in a magnetic read head. Referring to FIG. 3, a portion of a MR read head 20 on a substrate 21 is shown from the plane of an air bearing surface (ABS). There is an MTJ element 23 formed between a bottom lead 22 which is a bottom shield (S1) and a top lead 30 which is an upper shield (S2). The MTJ element 23 is comprised of a seed layer 24, an AFM layer 25, a pinned layer 26, a tunnel barrier layer 27, a free layer 28, and a cap layer 29 which are sequentially formed on the bottom lead 22 and have a composition and function similar to the corresponding layers in the MTJ element 1 described previously. Typically, the bottom lead 22 has a NiFe(~2 µm)/Ta configuration and the top lead 30 has a Ru/Ta/NiFe(~2 µm) configuration. In this example, the NiFe layer in the bottom lead 22 represents S1 and the NiFe layer in the top lead 30 represents S2. A read operation involves moving the read head along the ABS in the z direction over a recording medium which causes an external magnetic field to influence the magnetization direction of the free layer.

In U.S. Pat. No. 6,127,045, a high spin polarization layer ($Ni_{40}Fe_{60}$) is placed near the tunnel barrier layer in both the pinned and free layers of an MTJ device to increase the MR ratio. A negative magnetostriction layer ($Ni_{90}Fe_{10}$) is formed adjacent to each positive magnetostriction layer ($Ni_{40}Fe_{60}$) to essentially cancel the positive magnetostriction coefficient. A composite free layer comprised of a negative magnetostriction layer (Ni) on a positive magnetostriction layer ($Co_{50}Fe_{50}$) is modified in U.S. Pat. No. 6,674,617 by forming a soft magnetic layer such as $Ni_{80}Fe_{20}$ on the Ni layer to offset the hardness of nickel and thereby reduce the coercivity of the free layer.

Generally, the purpose of the capping layer is to protect underlying layers in the MTJ during etching and CMP processes and to function as an electrical contact to an overlying bit line. U.S. Pat. No. 6,266,218 describes a magnetic sensor in which a non-magnetic cap layer is comprised of Ta, Ru, or oxides thereof. An MTJ sensor is disclosed in U.S. Pat. No. 6,600,638 and employs a Ta capping layer of about 40 Angstroms while in U.S. Pat. No. 6,657,825 the cap layer is one of Ta or Rh. A Ru or Ta capping layer with a thickness of about 200 to 300 Angstroms is preferred in U.S. Pat. No. 6,703,654.

The capping layer is referred to as a protective layer in U.S. Pat. No. 6,624,987 and may be a multilayer film or a mixture of oxide and/or nitride of Ti, V, Cr, Co, Cu, Zn, Y, Zr, Nb, Mo, Tc, Ru, Pd, Ag, Hf, Ta, W, Re, Os, Ir, Pt, Au, Si, Al, Ni, or Re. However, Hayashi does not teach which elements are preferred or in which order the layers should be deposited in a multilayer capping structure to provide optimum performance. Thus an improved capping layer is needed to enable an MTJ to achieve a high MR ratio and low $\lambda_s$ value required for advanced MRAM technologies.

SUMMARY OF THE INVENTION

One objective of the present invention is to provide a free layer in an MTJ element that has well controlled magnetization and switching characteristics which result in a R-H (hysteresis) curve that does not contain kinks or a vortex.

A second objective of the present invention is to provide a capping layer on the free layer formed according to the first objective that enhances the MR ratio of the MTJ element.

A third objective of the present invention is to provide an MTJ element according to the first two objectives that has a low magnetostriction of less than about 1 E−06.

A fourth objective is to provide a method of forming an MTJ element with a high dR/R ratio and low magnetostriction.

According to a first embodiment, these objectives are achieved by providing a substrate on which an MRAM structure is to be formed. A bottom conductor electrode is formed on the substrate and may have a Ta/Cu/Ta/Ru configuration in which the Ru layer is subsequently removed by a sputter etch step that forms an amorphous Ta capping layer before the MTJ stack is deposited. An MTJ element consisting of a stack of layers is then formed on the bottom conductor electrode. In one embodiment, the MTJ element has a bottom spin valve configuration in which a seed layer, AFM layer, synthetic anti-parallel (SyAP) pinned layer, tunnel barrier layer, free layer, and a cap layer are sequentially formed. Preferably, the seed layer is NiCr and the AFM layer is MnPt. The SyAP pinned layer has a Ru coupling layer sandwiched between two CoFe layers. An oxidized Al (AlOx) layer is employed as the tunnel barrier layer. Above the tunnel barrier layer is a free layer comprised of NiFe that has a Fe content of about 17.5 to 20 atomic %. The capping layer in the MTJ stack is preferably a composite layer. In one aspect, the capping layer has a Ru/Ta/Ru configuration in which a lower inter-diffusion barrier layer on the free layer is a relatively thin Ru layer. The intermediate layer is an oxygen gettering layer such as Ta. The upper metal layer is a relatively thick Ru layer. All of the layers in the MTJ stack are formed by sputtering or ion beam deposition (IBD). Oxidation of the Al layer is accomplished by a radical oxidation (ROX) method. A conventional sequence is followed to define the sidewalls and top surface of the MTJ element, form a first insulation layer adjacent to the MTJ sidewalls, and form a top conductor electrode (bit line) on the MTJ's top surface.

In a second embodiment, the MTJ element is formed as a sensor in a MR read head. A bottom shield such as a NiFe layer with an overlying shield capping layer comprised of Ta is formed on a substrate. An MTJ element as described in the first embodiment is disposed on the shield capping layer. Preferably, the MTJ element has a composite free layer comprised of CoFe with a Fe content of about 10 atomic % and NiFe in which the Fe content is about 17.5 to 20 atomic %. In one aspect, the capping layer has a Ru/Ta/Ru configuration. A dielectric layer is formed on either side of the MTJ element to separate the MTJ from a hard bias layer that provides longitudinal biasing to the free layer. A second dielectric layer is formed on the hard bias layer and coplanar with the top surface of the MTJ. A top lead which is the upper shield is disposed on the top surface of the MTJ and on the second dielectric layer.

DETAILED DESCRIPTION OF THE INVENTION

The present invention is a composite capping layer for use in an MTJ stack of layers that enables the resulting device to have a high MR ratio and a low magnetostriction which are valuable properties required for high density devices with small MTJ sizes. Although MRAM and TMR read head applications are described herein, the present invention may be employed in other technologies based on an MTJ device as appreciated by those skilled in the art. The drawings are provided by way of example and are not intended to limit the scope of the invention. Moreover, the drawings are not necessarily drawn to scale and the relative sizes of various elements may vary compared to those in an actual device.

Figure 4:
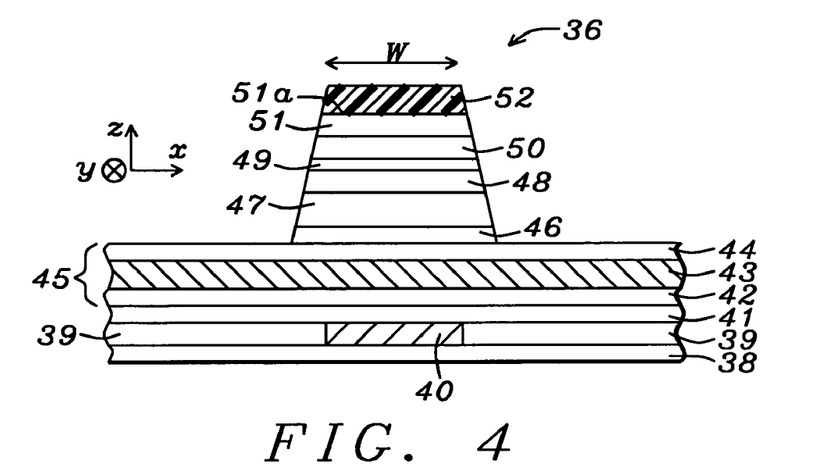
FIG. 4 is a cross-sectional view of a partially formed MRAM structure in which an MTJ element having a free layer and capping layer according to the first embodiment of the present invention is formed on a bottom conductor and above a word line.

An MRAM structure formed according to a first embodiment of the present invention will now be described. Referring to FIG. 4, a partially completed MRAM structure 36 is shown that includes a substrate 38 which may be silicon or another semiconductor substrate used in the art that typically contains other devices such as transistors and diodes. A first insulation layer 39 comprised of $Al_2O_3$, silicon oxide, or the like is disposed on the substrate 38. There is a first conductive line comprised of copper, for example, formed within and coplanar with the first insulation layer 39. For the purpose of this discussion, the first conductive line is a word line 40 that is used to conduct current in a +y or −y direction. Optionally, the first conductive line may be called a digit line, data line, row line, or column line as appreciated by those skilled in the art. The word line 40 may be enclosed on the sides and bottom by a thin diffusion barrier layer (not shown). There is a second insulation layer 41 such as $Al_2O_3$ or silicon oxide formed on the word line 40 and first insulation layer 39. Above the second insulation layer 41 is a bottom conductor layer 45 for interconnection to an underlying transistor in substrate 38. The bottom conductor layer 45 is typically coplanar with an insulation layer (not shown). In one aspect, the bottom conductor layer 45 is a composite layer having a seed layer 42/conductive layer 43/capping layer 44 configuration.

It is understood that the MRAM structure is part of an MRAM array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and bit lines are aligned orthogonal to each other and a bottom conductor layer may be used to connect each MTJ element with a transistor in the substrate. In the exemplary embodiment, an MTJ element is formed between a bottom conductor layer and bit line at each location where a bit line crosses over a word line.

The bottom conductor layer 45 may be a sectioned line, for example, that has a rectangular shape in the x,y plane and a thickness in the z direction. Alternatively, the bottom conductor layer 45 may be a bit line that is aligned orthogonally to an underlying word line 40 and to a subsequently formed second word line above the MTJ. In one embodiment, the bottom conductor layer 45 may have a NiCr/Ru/Ta configuration in which a seed layer 42 formed on the second insulation layer 41 is made of NiCr with a thickness of about 40 to 60 Angstroms. Optionally, the seed layer 42 may be comprised of Ta with a thickness of about 40 to 60 Angstroms. Above the seed layer 42 is a conductive layer 43 which has a thickness between about 100 and 200 Angstroms and is preferably comprised of Ru. As noted in U.S. Pat. No. 6,703,654 assigned to Headway Technologies, Inc., and which is herein incorporated by reference, other high melting point metals such as Ir and Rh that have a small grain size and a smooth surface may be used as the conductive layer 43. Alternatively, other metals such as Au or Cu may be used as the conductive layer 43.

The capping layer 44 may be a Ta layer with a thickness from about 30 to 50 Angstroms and after sputter etching has an amorphous character. According to one embodiment, the seed layer 42, conductive layer 43, a Ta capping layer 44, and an overlying Ru layer (not shown) are sequentially deposited by a sputtering or ion beam deposition (IBD) on the second insulation layer 41. As described in Headway patent application HT03-022 which is herein incorporated by reference, the Ru layer and a portion of the underlying Ta layer in the bottom conductor layer 45 are removed by sputter etching to generate an amorphous Ta capping layer that serves to promote uniform and dense growth in subsequently formed MTJ layers.

An MTJ stack of layers is now formed on the bottom conductor layer 45. It is understood that the MTJ stack may be formed in the same process tool as the bottom conductor layer. For instance, the bottom conductor layer 45 and MTJ stack can be formed in an Anelva 7100 system or the like which includes ultra high vacuum DC magnetron sputter chambers and oxidation chambers. Typically, the sputter deposition process involves an argon sputter gas and each sputter chamber has multiple targets which are low pressure discharge cathodes. The bottom conductor layer 45 and overlying MTJ layers may be formed after a single pump down of the sputter deposition system to enhance throughput.

In a preferred embodiment, the MTJ stack of layers is disposed on the bottom conductor layer 45 by sequentially forming a seed layer, AFM layer, SyAP pinned layer, tunnel barrier layer, free layer, and a capping layer. The seed layer 46 has a thickness of about 40 to 60 Angstroms and is preferably a layer of NiCr with a thickness of 45 Angstroms and a Cr content of about 35 to 45 atomic %. However, NiFe or NiFeCr may be used as the seed layer 46 instead of NiCr. Since the seed layer 46 is grown on an amorphous Ta capping layer 44, a smooth and dense <111> seed layer structure results. The inventors have previously practiced a process in which a NiCr seed layer is deposited on an amorphous Ta layer as described in Headway patent application HT03-025/031 which is herein incorporated by reference. A smooth and dense seed layer 46 is critical for smooth and densely packed growth in subsequently formed MTJ layers.

The AFM layer 47 is preferably made of MnPt with a thickness of about 100 to 200 Angstroms and more preferably 150 Angstroms although an IrMn layer having a thickness from about 50 to 100 Angstroms is also acceptable. The AFM layer is magnetically aligned in the y direction. An external magnetic field may be applied during the deposition of an MTJ layer such as an AFM layer to influence a magnetization along a certain axis.

The SyAP pinned layer 48 has an AP2/Ru/AP1 configuration. The AP2 layer is formed on the AFM layer 47 and is preferably comprised of CoFe with a composition of about 10 atomic % Fe and with a thickness of about 20 to 30 Angstroms and more preferably 23 Angstroms. The magnetic moment of the AP2 layer is pinned in a direction anti-parallel to the magnetic moment of the AP1 layer. The slight difference in thickness between the AP2 and AP1 layers produces a small net magnetic moment for the SyAP pinned layer 48 along the y axis. Exchange coupling between the AP2 layer and the AP1 layer is facilitated by a coupling layer that is preferably comprised of Ru with a thickness of about 7.5 Angstroms although Rh or Ir may be used instead of Ru. In one embodiment, the AP1 layer on the Ru coupling layer is comprised of CoFe with a composition of about 25 to 50 atomic % Fe and a thickness of about 15 to 25 Angstroms and more preferably 20 Angstroms. Optionally, the AP1 layer may be a composite layer that includes a thin nano-oxide layer (NOL) such as FeTaO or CoFeO sandwiched between CoFe layers. The nano-xide layer is employed to increase smoothness in the AP1 layer.

Above the SyAP pinned layer 48 is formed a thin tunnel barrier layer 49 which is preferably an oxidized Al layer that has an oxygen content which is close to an $Al_2O_3$ stoichiometry and is hereafter referred to as an AlOx layer. Initially, an Al layer having a thickness of about 8 to 10 Angstroms is deposited on the SyAP pinned layer 48 and is subsequently oxidized by an in-situ radical oxidation (ROX). An example of a ROX process that involves a plasma oxidation process in which a grid-like cap is placed between an upper ionizing electrode and a substrate surface (Al layer) in an oxidation chamber is described in the related patent application HT03-022 that has been incorporated by reference. The resulting AlOx layer has a thickness of about 11 to 15 Angstroms and preferably 14 Angstroms. The tunnel barrier layer 49 has excellent smoothness and uniformity because of the smooth and densely packed seed layer 46, AFM layer 47, and SyAP pinned layer 48 grown on the Ta capping layer 44.

One important feature of the present invention is that the free layer 50 formed on the tunnel barrier layer 49 is made of a moderate spin polarization material as understood by those skilled in the art. A high spin polarization material is defined as a CoFe alloy in which the atomic % of Fe is >20%, a NiFe alloy in which the atomic % of Fe is >50%, or a $[(CoFe)_m B_n]$ alloy with $\geq 25$ atomic % Fe in the CoFe composition. More generally, a high spin polarization material is one which has a magnetization saturation (Ms) value equal to or greater than the aforementioned alloys and a moderate spin polarization material is defined as one which has an Ms value less than the aforementioned alloys.

A moderate spin polarization material helps to minimize the magnetostriction ($\lambda_S$) in the MTJ element. For example, a NiFe layer in which the Fe content is between about 17.5 and 20 atomic % and preferably 17.5 atomic %, also referred to as NiFe(17.5%), may be advantageously employed as the free layer 50. In this case, the NiFe layer has a thickness between 30 and 60 Angstroms and preferably 40 Angstroms. The free layer 50 is magnetically aligned along the y-axis (pinned layer direction). When the MTJ is elliptically shaped as seen in a top view (FIG. 6), the easy axis of the MTJ element is along the long axis (y-direction).

A key feature of the present invention is the capping layer 51 which is a composite layer formed on the free layer 50. In one aspect, the capping layer 51 has a Ru/Ta/Ru configuration in which a lower metal layer that is preferably Ru having a thickness of about 10 to 30 Angstroms and more preferably 20 Angstroms is formed on the free layer 50. The lower metal layer serves as an inter-diffusion barrier between the NiFe free layer and the intermediate metal layer in the capping layer 51. Moreover, the thickness of the lower metal layer can be adjusted to further reduce magnetostriction in the free layer 50. The intermediate metal layer grown on the lower Ru layer is preferably an α-phase Ta layer with a low resistance and has a thickness from about 20 to 50 Angstroms and preferably 30 Angstroms. Above the intermediate metal layer is an upper metal layer that is preferably Ru with a thickness of about 150 to 250 Angstroms and preferably 210 Angstroms. Previously, the inventors produced an MTJ element with a standard capping layer comprised of a single Ru layer with a thickness of 250 Angstroms.

It is understood that a thick upper metal layer is required because of a subsequent ion beam etching (IBE) process that forms the sidewalls of the MTJ element and a subsequent planarization of an insulation layer adjacent to the MTJ which can cause erosion of the top surface of the MTJ. A slight thickness loss in the upper metal layer will have a minimal effect on the distance between a subsequently formed bit line and the free layer 50. Because the magnetic field strength generated by the bit line current at the free layer strongly depends on the thickness of the capping layer, the ability to control this parameter directly translates to improved control of the switching magnetic field at the free layer. Additionally, a thick upper Ru layer assures good electrical contact with an overlying bit line. Note that Ru is also preferred as the lower metal layer and upper metal layer in the composite capping layer 51 because Ru is inert to oxidation during annealing and is a low resistance conductor.

The inventors have surprisingly found that the RuFTa/Ru configuration for the capping layer 51 according to the first embodiment provides a combination of high MR ratio and low $\lambda_S$ value not previously achieved. For example, when the Ru/Ta/Ru capping layer 51 is integrated with a NiFe free layer as previously described, low magnetostriction is observed in the resulting MTJ element. It is believed that the mechanism responsible for the high MR ratio involves gettering oxygen in the free layer 50 by the intermediate Ta layer in the composite capping layer 51. It is known that oxygen is highly mobile in a NiFe alloy and in transition metals such as Ru and has a strong tendency to diffuse out to react with an adjacent Ta layer. By using a Ru/Ta/Ru capping layer, the underlying NiFe free layer is less oxygen contaminated and has higher conductivity. A very small amount of oxygen is gettered by the intermediate Ta layer which results in an insignificant loss in conductivity of the capping layer 51.

Another advantage of the present invention compared to prior art is an improved switching characteristic of the resulting MTJ device. It is observed that R-H switching (hysteresis) curves of MTJs with a NiFe(17.5%) free layer is free of kinks and a vortex. An MTJ with a high spin polarization free layer yields a R-H curve (not shown) with a kink that originates from vortex or domain wall pinning/dragging which strongly correlates with MTJ element shape and saturation magnetization in the free layer. As far as free layer switching is concerned, a moderate spin polarization layer such as a NiFe (17.5%) layer is preferred because it is associated with more controlled magnetization and switching characteristics that are critical for MRAM applications.

Alternatively, the capping layer 51 may be comprised of a Ta/Ru composite layer in which a Ta layer with a thickness of about 10 to 30 Angstroms is formed on the free layer 50 and a Ru layer with a thickness of about 150 to 250 Angstroms is formed on the Ta layer. However, this configuration is less preferred than the Ru/Ta/Ru composite layer because the inter-diffusion barrier layer has been omitted and Ta diffusion into the NiFe free layer results in a more vortex-like structure. The inventors have also found that the $V_{50}$ of the MTJ is increased from 600 to 800 mV with the Ta/Ru capping layer configuration. Thus, effective dR/R at the MTJ bias condition (normally 400 mV) is higher.

The present invention also encompasses an annealing step after all of the MTJ layers have been deposited. For example, the AFM layer may be annealed while applying an external magnetic field along the y-axis.

After all of the MTJ layers have been deposited, an MTJ element with sidewalls and a top surface 51a is fabricated by first coating and patterning a photoresist layer 52 that has a width w on the capping layer 51. Next, the photoresist layer 52 is employed as an etch mask during an IBE sequence that removes regions of the MTJ stack of layers 46-51 which are not protected by the etch mask. As a result, an MTJ element is formed that typically has sloped sidewalls in which the capping layer 51 has a width w and the seed layer 46 has a width greater than w.

Figure 5:
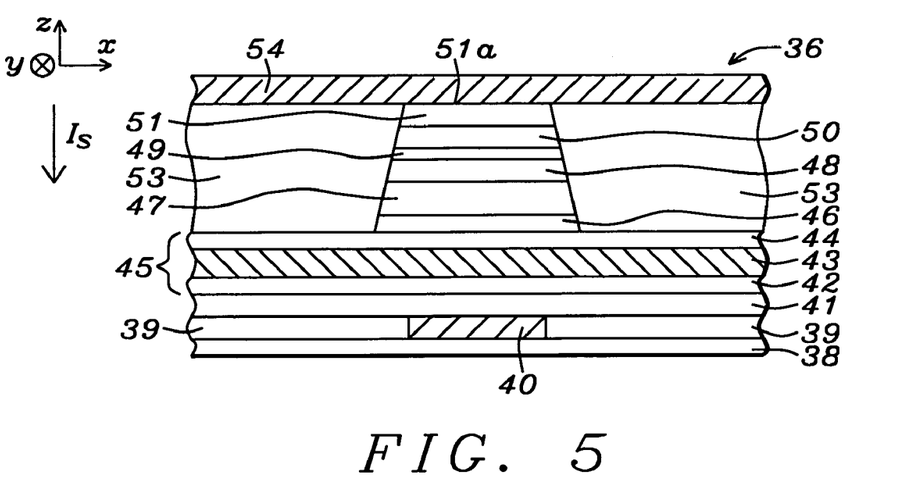
FIG. 5 is a cross-sectional view of the MRAM structure in FIG. 4 after a photoresist mask is removed and an insulation layer is formed adjacent to the MTJ element and a bit line is formed on the top surface of the MTJ element.

Referring to FIG. 5, the photoresist layer 52 is removed by a conventional method that may involve a wet stripper or an oxygen ashing process. A standard cleaning step may be performed at this point to ensure that all organic residue is removed after the stripping step. Then a third insulation layer 53 is formed on the bottom electrode 45 and adjacent to the MTJ sidewalls by a conventional method that may involve depositing an insulation material with an appropriate dielectric constant and then planarizing the third insulation layer 53 to be coplanar with the top surface 51a of the MTJ element.

The next step in fabricating the MRAM cell 40 is to form a top conductor (bit line) 54 on the third insulation layer 53 that contacts the top surface 51a of the MTJ element. The bit line 54 is aligned in a direction orthogonal to that of the word line 40 and may be comprised of more than one layer. For instance, a top conductor layer such as Cu, Au, or Al may be enclosed on the sides and bottom by a diffusion barrier layer as appreciated by those skilled in the art. In the exemplary embodiment, the bit line 54 is used to carry current in a +x or −x direction and the word line 40 has a lengthwise direction along the y-axis. When the bottom conductor layer 45 is a sectioned line with a rectangular shape, a longer side may be formed in the y direction and the shorter side may be formed in the x direction. According to a well known right hand rule, a current flowing through the bit line 54 generates a first magnetic field in the easy axis direction of the free layer while a current in the word line 40 produces a second magnetic field in the hard axis direction during a write operation. The direction of flow and magnitude of the bit line current and word line current is changed to align the magnetization of the free layer 70 in a particular direction.

Figure 6:
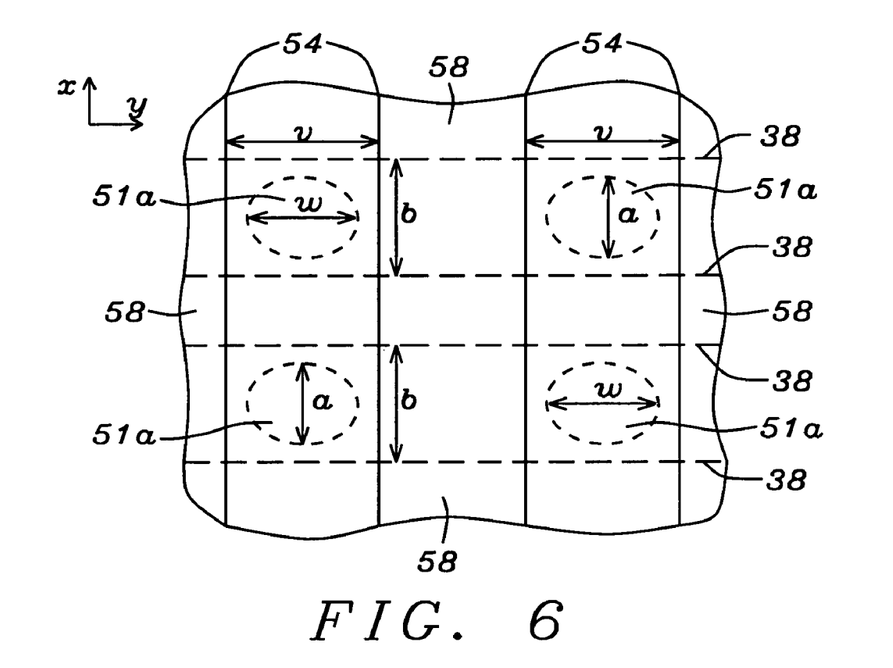
FIG. 6 is a top view of an MRAM array in which an array of elliptically shaped MTJ elements are interposed between bit lines and word lines.

Referring to FIG. 6, a top view of an MRAM array is shown that is comprised of four MRAM cells, four MTJ elements, two word lines 40 and two bit lines 54. The bottom conductor layer 45 is not shown in order to simplify the drawing. The word lines 40 have a width b and the bit lines 54 have a width v. It is understood that the bit lines 54 are coplanar with and separated by a fourth insulation layer 58 that may contain the same dielectric material as in the first, second, and third insulation layers 39, 41, 53. In a preferred embodiment, the top surface 51a of the MTJ element and each layer 46-51 within the MTJ has an elliptical shape with a length w along the long axis (y-direction) and a width a along the short axis (x-direction). However, the present invention also anticipates MTJ shapes that are circular or rectangular. The width v of a bit line 54 may be larger than the length w and the width b of a word line 40 may be larger than the width a of an MTJ element.

An experiment was conducted to determine the performance of an MTJ element formed between a bottom conductor layer 45 and bit line 54 in an MRAM cell according to the first embodiment. Table 1 provides background data that shows the relative performance of a NiFe (17.5%) free layer compared with free layers comprised of high spin polarization materials. Results in Table 1 were obtained with a conventional Ru capping layer in the MTJ element. The actual MTJ configuration is represented by Ta/NiCr40/MnPt100/CoFe(10%)23/Ru/CoFe(25%)20/Al10-ROX/free layer/Ru250. The results in Table 1 indicate that while a high spin polarization material such as NiFe(60%) can be employed as a free layer to increase dR/R in the MTJ element, an undesirably large magnetostriction results. On the other hand, the dR/R for a moderate spin polarization free layer like NiFe (17.5%) is not sufficiently high to satisfy a requirement of dR/R>30% for a high performance MTJ. Note that a $\lambda_S$ value "much" larger than about 1.0E−6 is not acceptable for a free layer in high density MRAM arrays. A $\lambda_S$ value in the range of −1.0E−7 to +1.0E−7 where (−) indicates a compressive stress and (+) indicates a tensile stress means the free layer is non-magnetorestrictive.

TABLE 1

Magnetic Properties of MTJs with Various Free Layers

| Free Layer | Thickness (Angstroms) | dR/R (%) | RA (ohm-um$^2$) | Lambda ($\lambda_S$) |
|---|---|---|---|---|
| NiFe(17.5%) | 40 | 25-28 | 3500-4000 | −2.7E−7 |
| CoFe(25%) | 40 | 50-55 | 3500-4000 | +5.0E−6 |
| [CoFe(25%)]$_{0.8}$B$_{0.2}$ | 40 | 50-55 | 4000-5000 | +9.44E−6 |
| NiFe(60%) | 40 | 45-50 | 3500-4000 | +1.97E−5 |
| NiFe(60%)/ NiFe(17.5%) | 5/40 | 35% | 3500-4000 | +4.08E−6 |
| NiFe(70%)/ NiFe(17.5%) | 5/40 | 38% | 3500-4000 | +6.23E−6 |

To demonstrate the improvement realized by fabricating an MTJ according to the present invention, MTJ stacks in an MRAM array were formed in an Anelva 7100 sputtering system. The AlOx tunnel barrier layer in each sample was formed by first depositing a 10 Angstrom thick Al film which was in-situ oxidized by a radical oxidation (ROX) process as described previously. All samples were prepared by first depositing a bottom conductor layer comprised of Ta/Ru/Ta/Ru and then sputter etching to provide an amorphous Ta capping layer. The MTJ in each sample has a stack formed by sequentially depositing a NiCr seed layer (45 Angstroms), a MnPt AFM layer (150 Angstroms), a SyAP pinned layer that includes a CoFe (10% Fe) AP2 layer (23 Angstroms)/ Ru coupling layer (7.5 Angstroms)/ CoFe (25% Fe) AP1 (20 Angstroms) configuration, the AlOx tunnel barrier layer, a NiFe free layer (40 Angstroms), and a capping layer. The capping layer configuration is varied as indicated in Table 2.

TABLE 2

Magnetic Properties of MTJs with Different Capping Layers

| Capping Layer | Al thickness | dR/R (%) | Bs | RA (ohm-um$^2$) | Lambda ($\lambda s$) |
|---|---|---|---|---|---|
| Ru 250 | 10 | 28.1 | 0.61 | 4500 | −1.90E-7 |
| Ru 10/Ta 30/Ru 210 | 10 | 38.2 | 0.61 | 3320 | −2.70E-7 |
| Ru 30/Ta 30/Ru 210 | 10 | 40.1 | 0.6 | 3695 | −1.01E-6 |
| Ta 30/Ru 210 | 10 | 39.1 | 0.47 | 3680 | +4.54E-6 |
| Ru 10/Ta 30/Ru 210 | 9 | 39.5 | 0.60-0.61 | 1376 | — |

As shown in Table 2, the RA and dR/R for the reference MTJ with a conventional Ru capping layer are 4500 ohm$\mu$m$^2$ and 28.1%, respectively. When using a Ru/Ta/Ru capping layer or a Ta/Ru capping layer, the dR/R ratio is increased to >38% and 39%, respectively. Note that the RA is reduced for the Ru/Ta/Ru and Ta/Ru configurations compared to the conventional Ru capping layer. In the Ta/Ru sample, Bs of the free layer was reduced from 0.60 to 0.47 which indicates a sizable inter-diffusion between the NiFe free layer and the Ta layer has occurred and an alloy of Ta and NiFe was produced. Additionally, the magnetostriction of the free layer is high when capped with a Ta/Ru composite layer. A Ru/Ta/Ru capping layer according to the present invention provides the best combination of high dR/R, lower RA, and low $\lambda_S$. Furthermore, the $\lambda_S$ value may be modified by adjusting the thickness of the lower Ru layer as mentioned earlier. Therefore, an MTJ element with higher performance has been fabricated than achieved in prior art.

The last entry in Table 2 demonstrates that the RA can be further decreased while maintaining a high dR/R by reducing the thickness of the Al layer from 10 to 9 Angstroms before the ROX process. It is known by those skilled in the art that the RA of a dielectric tunnel barrier layer (AlOx) is an exponential function of the tunnel barrier layer (Al) thickness. When a low RA is required for very high density MRAM arrays, a thinner Al layer is deposited. For example, an RA on the order of 4000 ohms$\mu$m$^2$ is observed for an Al10-ROX tunnel barrier layer and an RA on the order of 200 ohms$\mu$m$^2$ is achieved only with a thinner tunnel barrier layer such as Al8-ROX.

Figure 7:
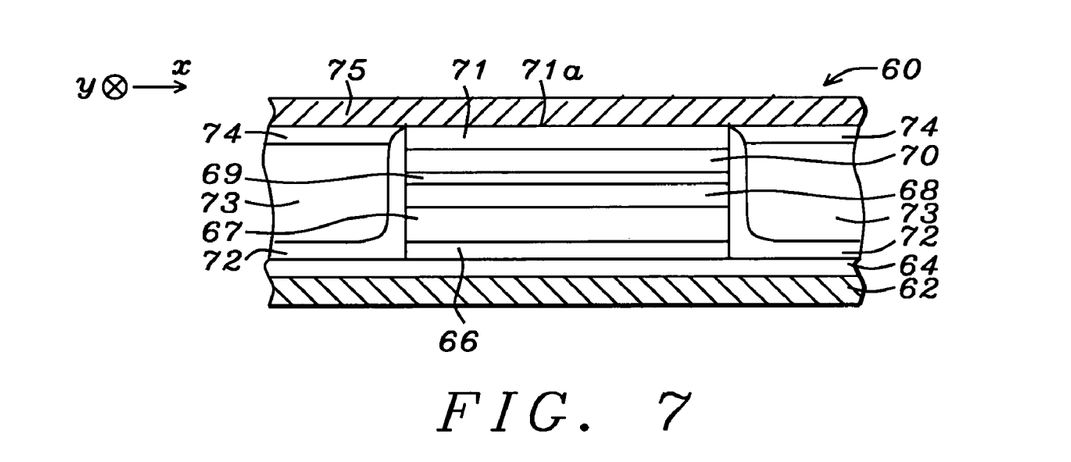
FIG. 7 is a cross-sectional view of a TMR read head in which an MTJ element according to the second embodiment of the present invention is formed between a bottom shield and an upper shield and is separated from a hard bias layer by an insulation layer.

In a second embodiment depicted in FIG. 7, a magnetoresistive (TMR) read head 60 is shown in which an MTJ element is formed between a bottom (S1) shield 62 and an upper (S2) shield 75. A composite capping layer is formed on a moderate spin polarization layer such as a NiFe(17.5%) free layer in the MTJ to enhance dR/R and provide acceptable magnetostriction.

A substrate 62 is provided that may be a bottom shield comprised of NiFe in the TMR read head 60 as is understood by those skilled in the art. A shield capping layer 64 is formed on the bottom shield 62 by a previously described method that involves sequentially depositing a Ta layer with a thickness of about 50 to 80 Angstroms and a Ru layer with a thickness of between 20 and 30 Angstroms on the bottom shield 62. Thereafter, the Ru layer is removed by a sputter etch process that also partially removes the underlying Ta layer to form an amorphous Ta layer as the shield capping layer 64. The shield capping layer 64 has a thickness of about 30 to 50 Angstroms and is employed to promote a smooth and dense growth of layers in a subsequently formed MTJ element. Optionally, the shield capping layer 64 may be comprised of a composite layer in which the bottom layer functions as a capping layer for the bottom shield 62 and also promotes smooth and dense growth in subsequently formed layers as appreciated by those skilled in the art. A capping layer for an S1 shield can be amorphous $(Co_{75}Fe_{25})_{0.8}B_{0.2}$, for example.

An MTJ stack of layers is now formed on the shield capping layer 64 and may be deposited in the same process tool in which the shield capping layer is formed. Preferably, the process tool is an Anelva 7100 system or the like which includes ultra high vacuum sputter chambers and oxidation chambers and has the capability to form all layers in the MTJ element after a single pump down step.

In one embodiment, an MTJ stack of layers is disposed on the shield capping layer 64 by sequentially forming a seed layer 66, AFM layer 67, SyAP pinned layer 68, tunnel barrier layer 69, free layer 70, and a capping layer 71. The seed layer 66 may be a NiCr layer with the same thickness and composition as the seed layer 46 in the first embodiment. Similarly, the AFM layer 67, SyAP pinned layer 68, and tunnel barrier layer 69 may have the same composition as described for AFM layer 47, SyAP pinned layer 48, and tunnel barrier layer 49, respectively, in the first embodiment. However, in the TMR read head 60, the initially deposited Al layer is about 5.5 to 6 Angstroms thick and is subsequently oxidized by a natural oxidation (NOX) process to form the tunnel barrier layer 69.

One important feature of the present invention is that the free layer 70 formed on the tunnel barrier layer 69 is made of a low to moderate spin polarization material such as NiFe (17.5%) described in the first embodiment. A low to moderate spin polarization material helps to minimize the magnetostriction ($\lambda_S$) in the MTJ element. Preferably, the free layer 70 is a composite layer with a CoFe/NiFe configuration in which the CoFe alloy has a Fe content of about 10 atomic % and a thickness of between 5 to 10 Angstroms with 10 Angstroms being preferred while the NiFe layer has a Fe content of about 17.5 to 20 atomic % and a thickness between about 30 and 40 Angstroms. The free layer 70 may be magnetically aligned in the x direction during deposition.

A key feature of the present invention is the capping layer 71 which is a composite layer formed on the free layer 70. In one aspect, the capping layer 71 has a Ru/Ta/Ru configuration in which a lower metal layer that is preferably Ru having a thickness of about 10 to 30 Angstroms and preferably 20 Angstroms is formed on the free layer 70. The lower metal layer serves as an inter-diffusion barrier between the NiFe free layer and the intermediate metal layer in the capping layer 71. Moreover, the thickness of the lower metal layer can be adjusted to further reduce magnetostriction in the free layer 70. The intermediate metal layer is preferably an $\alpha$-phase Ta layer with a thickness from about 20 to 50 Angstroms and more preferably 30 Angstroms that functions as an oxygen gettering layer to remove oxygen from the free layer 70. Above the Ta layer is an upper metal layer that is preferably Ru with a thickness of about 100 to 200 Angstroms and preferably 150 Angstroms. A thick upper Ru layer is required because of a subsequent ion beam etching (IBE) process that forms the sidewalls of the MTJ element. Ru is preferred as the upper and lower metal layer in the composite capping layer because it has excellent conductivity, serves as a good inter-diffusion barrier, forms a smooth surface for optimizing electrical contact with the overlying top lead which is the upper (S2) shield of the TMR read head.

The inventors have surprisingly found that the Ru/Ta/Ru configuration for the capping layer 71 according to the second embodiment provides a combination of high MR ratio and low $\lambda_S$ value not previously achieved. For example, when the Ru/Ta/Ru capping layer 71 is integrated with a free layer 70 as previously described, low magnetostriction is observed in the resulting MTJ element. Alternatively, the capping layer 71 may be comprised of a Ta/Ru composite layer in which a Ta layer with a thickness of about 30 to 50 Angstroms is formed on the free layer 70 and a Ru layer with a thickness of about 100 to 200 is formed on the Ta layer. However, this configuration is less preferred since the inter-diffusion barrier layer is not included.

The present invention also encompasses one or more annealing steps after all of the MTJ layers have been deposited. For example, the AFM layer may be annealed while applying an external magnetic field along the y-axis. In the case of a TMR read head, the free layer may be annealed by applying a smaller external magnetic field along the x-axis.

After all of the MTJ layers have been deposited, an MTJ element is fabricated by forming a lift-off photoresist pattern (not shown) on the top surface 71a followed by IBE etching to selectively remove portions of the MTJ stack of layers 66-71 which are not protected by the photoresist mask. As a result, an MTJ element is formed that typically has sloped sidewalls wherein the width of the seed layer 66 is greater than the width of the capping layer 71 and the width of the top surface 71a determines the track width. After the IBE process, a dielectric layer 72 comprised of $Al_2O_3$, for example, is deposited to a thickness of about 100 to 150 Angstroms by a chemical vapor deposition (CVD) or physical vapor deposition (PVD) on the sidewalls of the MTJ element and on the shield capping layer 64. Next, a hard bias layer 73 preferably having a TiW/CoCrPt/Ta configuration (not shown) and a second $Al_2O_3$ dielectric layer 74 are sequentially deposited on the first dielectric layer 72. The hard bias layer has a thickness of about 200 to 300 Angstroms and the second dielectric layer has a thickness between about 200 and 250 Angstroms. The photoresist mask and overlying layers 72-74 are lifted off by a conventional method to uncover the top surface 71a. Note that the top surface 71a is preferably coplanar with the adjacent second dielectric layer 74. A chemical mechanical polish (CMP) step may be employed to planarize the second dielectric layer. An upper shield 75 is then formed on the top surface 71a and second dielectric layer 74 to complete the TMR read head 60.

The advantages of the second embodiment are the same as those realized in the first embodiment. The dR/R achieved by the MTJ element in the TMR read head of the second embodiment is greater than about 20% with a magnetorestriction of less than about 1.0E−6. Thus, a high performance TMR read head is realized with a unique combination of high dR/R, lower RA, and low magnetostriction by employing a composite seed layer on the MTJ stack as described herein.

While this invention has been particularly shown and described with reference to, the preferred embodiment thereof, it will be understood by those skilled in the art that various changes in form and details may be made without departing from the spirit and scope of this invention.

We claim:

1. A method of forming an MTJ element on a substrate, comprising:
   (a) sequentially forming a seed layer, an AFM layer, a pinned layer, and a tunnel barrier layer on a substrate;
   (b) forming a moderate spin polarization free layer on the tunnel barrier layer; and
   (c) forming a capping layer on said moderate spin polarization free layer wherein said capping layer is comprised of a lower inter-diffusion barrier layer comprised of Ru that contacts said moderate spin polarization free layer, a middle oxygen gettering layer made of Ta, and an oxidation resistant upper metal layer formed on the middle oxygen gettering layer, said oxidation resistant upper metal layer is comprised of Ru and has a top surface that is essentially planar and all layers in said capping layer that has a Ru/Ta/Ru configuration have substantially the same width.

2. The method of claim 1 wherein the substrate is a bottom conductor in an MRAM structure.

3. The method of claim 2 further comprised of forming a top conductor on the top surface of said upper metal layer.

4. The method of claim 2 wherein said tunnel barrier layer is comprised of AlOx and is formed by depositing an Al layer with a thickness of about 8 to 10 Angstroms on said pinned layer and then performing an in-situ radical oxidation (ROX) process.

5. The method of claim 2 wherein the moderate spin polarization free layer is comprised of NiFe with an Fe content from about 17.5 to 20 atomic % and a thickness of about 20 to 50 Angstroms.

6. The method of claim 1 wherein the substrate is a shield capping layer on a bottom shield in a TMR read head.

7. The method of claim 6 further comprised of forming an upper shield on the top surface of said oxidation resistant upper metal layer.

8. The method of claim 6 wherein said tunnel barrier layer is comprised of AlOx and is formed by depositing an Al layer with a thickness of about 5 to 6 Angstroms on said pinned layer and then performing an in-situ natural oxidation (NOX) process.

9. The method of claim 6 wherein the moderate spin polarization free layer is a composite CoFe/NiFe layer comprised of CoFe with a Fe content of about 10 atomic % and a thickness of about 5 to 10 Angstroms and NiFe with a Fe content from about 17.5 to 20 atomic % and a thickness of about 30 to 40 Angstroms.

10. The method of claim 1 wherein the seed layer is comprised of NiCr, the AFM layer is comprised of MnPt, and the pinned layer is a SyAP pinned layer comprised of a lower CoFe layer that has a Fe content of about 10 atomic %, a middle Ru coupling layer, and an upper CoFe layer that has a Fe content from 25 to 50 atomic %.

11. The method of claim 1 wherein the lower inter-diffusion barrier layer has a thickness of about 10 to 30 Angstroms.

12. The method of claim 1 wherein said middle oxygen gettering layer has a thickness between about 20 and 50 Angstroms.

13. The method of claim 1 wherein the oxidation resistant upper metal layer has a thickness of about 100 to 250 Angstroms.

14. The method of claim 1 wherein all layers in the MTJ element are deposited in an ultra high vacuum sputtering system comprised of sputtering chambers and an oxidation chamber wherein all layers are formed after a single pump down step.

15. The method of claim 1 wherein said substrate has an upper amorphous Ta layer that promotes smooth and dense growth in the layers within said MTJ element.

* * * * *